United States Patent
Marioni

(10) Patent No.: US 7,944,711 B2
(45) Date of Patent: May 17, 2011

(54) DISCRETE ELECTRONIC COMPONENT AND RELATED ASSEMBLING METHOD

(75) Inventor: Elio Marioni, Dueville (IT)

(73) Assignee: Askoll Holding S.r.l. (IT)

( * ) Notice: Subject to any disclaimer, the term of this patent is extended or adjusted under 35 U.S.C. 154(b) by 188 days.

(21) Appl. No.: 12/396,108

(22) Filed: Mar. 2, 2009

(65) Prior Publication Data

US 2009/0168368 A1  Jul. 2, 2009

Related U.S. Application Data

(63) Continuation of application No. 11/741,022, filed on Apr. 27, 2007, now abandoned, which is a continuation of application No. 11/053,478, filed on Feb. 8, 2005, now abandoned.

(30) Foreign Application Priority Data

Feb. 12, 2004 (EP) ..................................... 04425094

(51) Int. Cl.
*H05K 7/02* (2006.01)

(52) U.S. Cl. ........ 361/807; 361/704; 361/707; 361/760; 361/764; 361/794; 257/704; 257/705; 257/713

(58) Field of Classification Search .................. 361/807, 361/704, 707, 760, 764, 794; 257/700–705, 257/200, 713, 691
See application file for complete search history.

(56) References Cited

U.S. PATENT DOCUMENTS

| | | | |
|---|---|---|---|
| 3,597,666 A * | 8/1971 | Taskovich | ..................... 257/674 |
| 3,763,403 A | 10/1973 | Lootens | |
| 4,872,102 A | 10/1989 | Getter | |
| 5,179,506 A * | 1/1993 | Corbett et al. | ................. 361/807 |
| 5,408,383 A * | 4/1995 | Nagasaka et al. | ............. 361/707 |
| 5,557,116 A | 9/1996 | Masui et al. | |
| 5,580,269 A | 12/1996 | Fan | |
| 5,808,869 A | 9/1998 | Donahoe et al. | |
| 5,816,826 A | 10/1998 | Colemen | |
| 5,842,514 A | 12/1998 | Zapach et al. | |
| 5,971,775 A | 10/1999 | Tor et al. | |
| 6,078,491 A | 6/2000 | Kern et al. | |
| 6,236,109 B1 | 5/2001 | Hsuan et al. | |
| 6,411,514 B1 | 6/2002 | Hussaini | |
| 6,431,882 B1 | 8/2002 | Noda et al. | |
| 6,801,431 B2 | 10/2004 | Hartke et al. | |
| 6,853,559 B2 * | 2/2005 | Panella et al. | ................. 361/764 |
| 6,856,503 B2 | 2/2005 | Apfelbacher et al. | |
| 6,926,542 B2 | 8/2005 | Li | |
| 6,936,917 B2 * | 8/2005 | Lopata et al. | ................. 257/704 |
| 2001/0053070 A1 | 12/2001 | Kitamura et al. | |
| 2002/0047361 A1 * | 4/2002 | Naito et al. | ................. 310/68 R |
| 2002/0071251 A1 | 6/2002 | Gerlock et al. | |
| 2002/0109220 A1 | 8/2002 | Ashdown | |
| 2004/0079090 A1 | 4/2004 | Tsuji | |

* cited by examiner

*Primary Examiner* — Xiaoliang Chen
(74) *Attorney, Agent, or Firm* — Akerman Senterfitt

(57) ABSTRACT

The present invention relates to a substantially package-like discrete electronic component of the type comprising a power electronic circuit, a body or casing, substantially parallelepiped, and electric connecting pins connected inside the body with said circuit and projecting from said body for an electric connection on the electronic printed circuit board. The body has a heat dissipating header having at least one surface emerging from the body and laying on a plane whereas the pins project from the body for a first section initially extended parallel to the plane. Advantageously a pair of pins has a substantially U-shaped bending, after the first section parallel to the plane for allowing a more stable bearing of the component during the step of welding to a heat dissipating intermediate die.

8 Claims, 4 Drawing Sheets

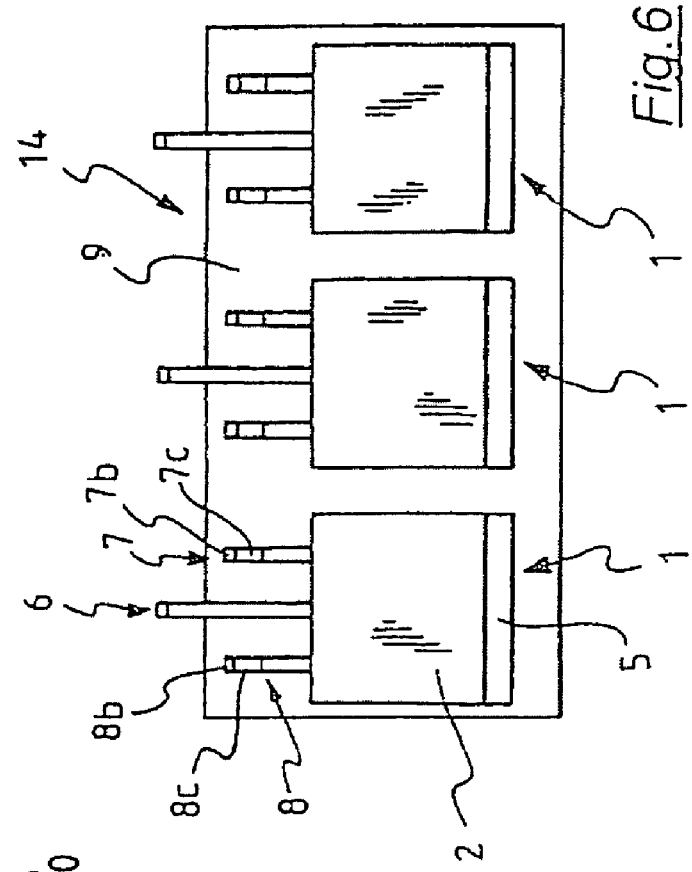
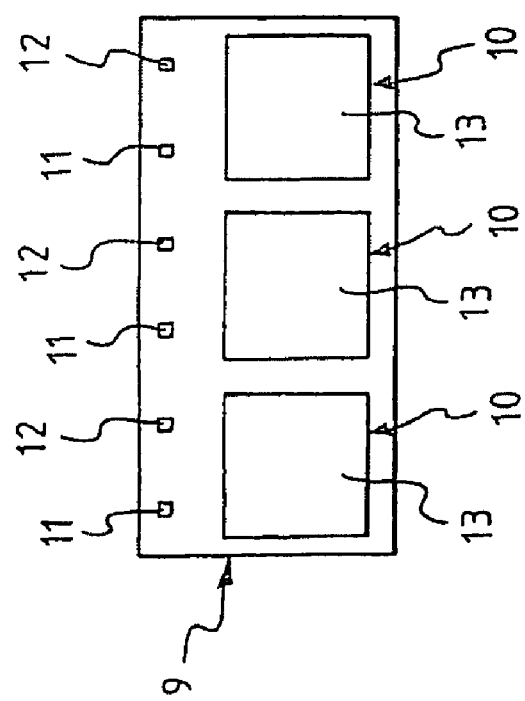

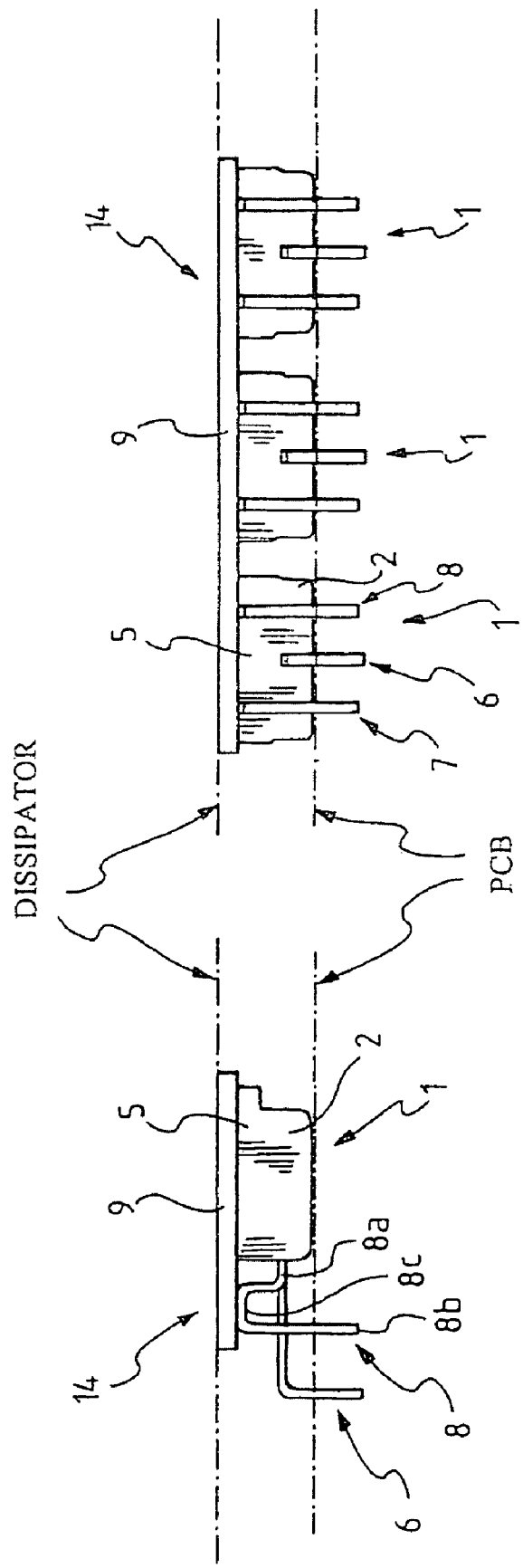

DISCRETE ELECTRONIC COMPONENT AND RELATED ASSEMBLING METHOD

CROSS-REFERENCE TO RELATED APPLICATIONS

This application is a continuation of U.S. patent application Ser. No. 11/741,022, filed Apr. 27, 2007, which was a continuation of U.S. patent application Ser. No. 11/053,478, filed Feb. 8, 2005.

FIELD OF APPLICATION

The present invention relates to a discrete electronic component such as for example a power switch. The invention also relates to a related assembling method of this discrete electronic component on an electronic board.

During recent years the use of these discrete electronic components in printed circuit boards has undergone a considerable increase being the same simple to be controlled and reliable in the applications.

PRIOR ART

As it is well known, the substantially package-like discrete electronic components comprise a power electronic circuit assembled on a small metallic frame, wherein some electric connecting pins are defined, and a protecting body or casing realised with insulating plastic material, for example an epoxy resin. The connecting pins project from said body and they allow, once the discrete electronic components are assembled on a printed circuit board, the transmission of electronic signals from and towards conduction paths defined in the board itself.

As it is known, these discrete electronic components have a high dissipation of energy and they are provided with an internal heat sink element. This element can comprise for example a header associated with the discrete electronic component and incorporated in the body of plastic material.

During the assembling step of the component on the board the header, in many cases, happens to stay at the opposite part with respect to the board itself and it facilitates the dissipation of heat.

During the designing step of the board attention has to be paid on where these discrete electronic components are installed by using some solutions which allow a good thermal conduction capacity so as to convey and evacuate the energy dissipated therefrom. When more discrete electronic components are in a same board it is known that it is preferable to group all the components on a single area and to equip the area with a big heat sink of the type with fins.

It is known technical teaching to interpose, between the heat sink with fins and each header of the discrete electronic components, an intermediate die realised with an electric insulating material and good conductor of heat, for example alumina. This intermediate die also allows to block two or more adjacent discrete components for being assembled together on the printed circuit board. This blocking occurs by means of check means such as clips or the like.

During the assembling step it will thus be needed to place the electronic components on the printed circuit board, to place the intermediate dies, to fix the clips and then to place on top the heat sink with fins.

Although advantageous under several aspects, and substantially meeting the aim, this first known technical solution has a drawback hereafter underlined. The assembly thus described cannot occur mechanically, in fact the clips will have to be manually placed by an operator and this with a considerable expenditure of time and increased costs.

A second solution to the underlined technical problem could be that of fixing, by means of a fixer of metallic alloy paste, the headers of the discrete electronic components to the intermediate die and thus placing the obtained component on the board.

Also this second solution is not exempt from drawbacks; in particular, once the header of each discrete component is placed on the intermediate die, everything must be transferred into a remelting oven. During this fixing step the headers of each discrete electronic component could rotate fixing on the die in a wrong and/or misaligned position.

This would make the operation itself vain and useless in fact the obtained component could not be installed on the board since there would not be correspondence between the pins of the discrete electronic components and the printed circuit.

The technical problem underlying the present invention is that of devising a discrete electronic component having such structural and functional characteristics as to allow a simple, fast and univocal fixing of the same on a supporting die for being subsequently assembled together with other components on a printed circuit board overcoming the drawbacks cited with reference to the prior art.

SUMMARY OF THE INVENTION

The solution idea underlying the present invention is that of realising a discrete electronic component which can be tied easily and with geometrical precision to the intermediate die for subsequently allowing a fast and easy assembly also of groups of these components on the printed circuit board and by means of manipulation automatic means such as for example machines of the pick-and-place type.

In substance, according to the invention, each discrete electronic component stays blocked on the intermediate die also during the fixing step in the remelting oven.

On the basis of this solution idea the technical problem is solved by a discrete electronic component of the previously indicated type and characterised in that at least one of said pins has a substantially U-shaped bending, after said first section, with the basis of the U being tangent to said plane.

The characteristics and advantages of the discrete electronic component according to the invention and of the related assembling method will be apparent from the following description of an embodiment thereof given by way of indicative and non-limiting example making reference to the annexed drawings.

BRIEF DESCRIPTION OF THE DRAWINGS

FIG. 3 shows a plan view of an intermediate die provided between the discrete components and the heat sink with fins;

FIG. 4 shows a front view of three discrete electronic components, realised according to the present invention, connected with an intermediate dissipating die;

FIG. 5 is a side view of FIG. 4;

FIG. 6 is a bottom view of FIG. 4.

DETAILED DESCRIPTION

Figure 1:
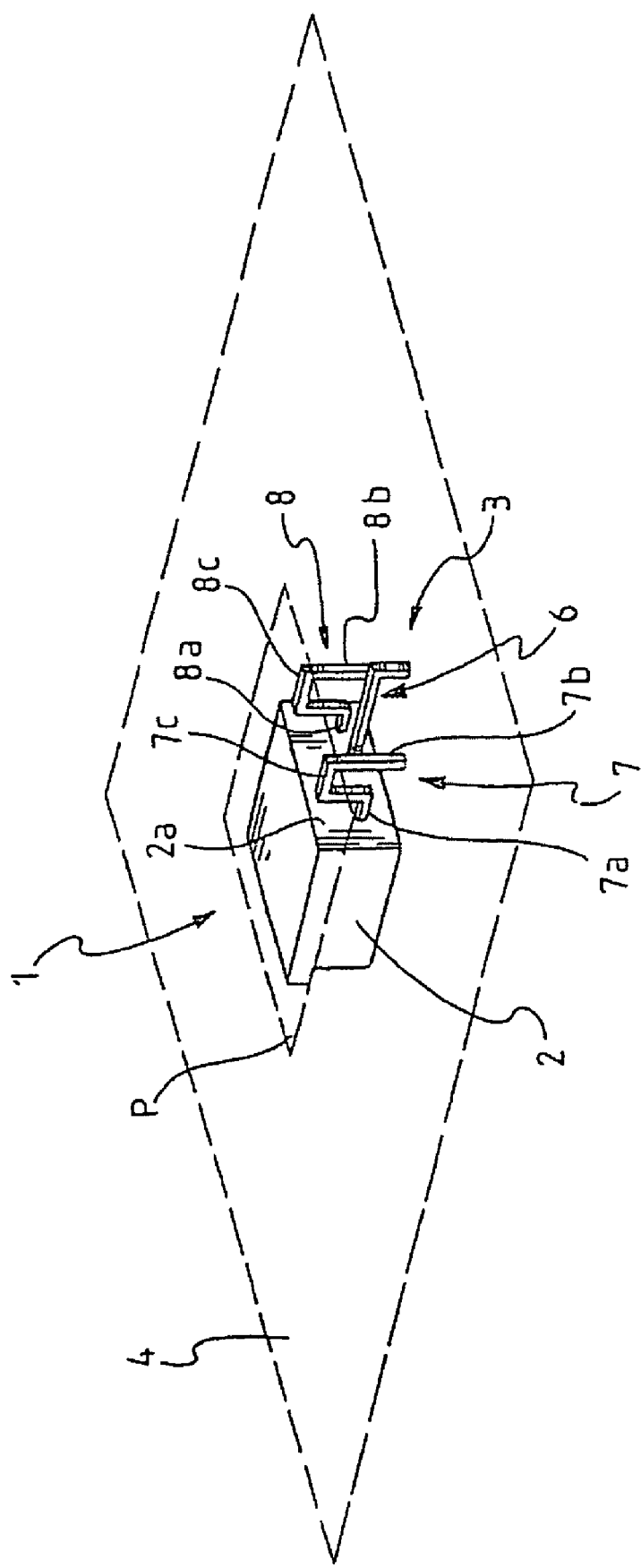
FIG. 1 shows a schematic perspective view of a discrete electronic component realised according to the present invention.
Figure 2:
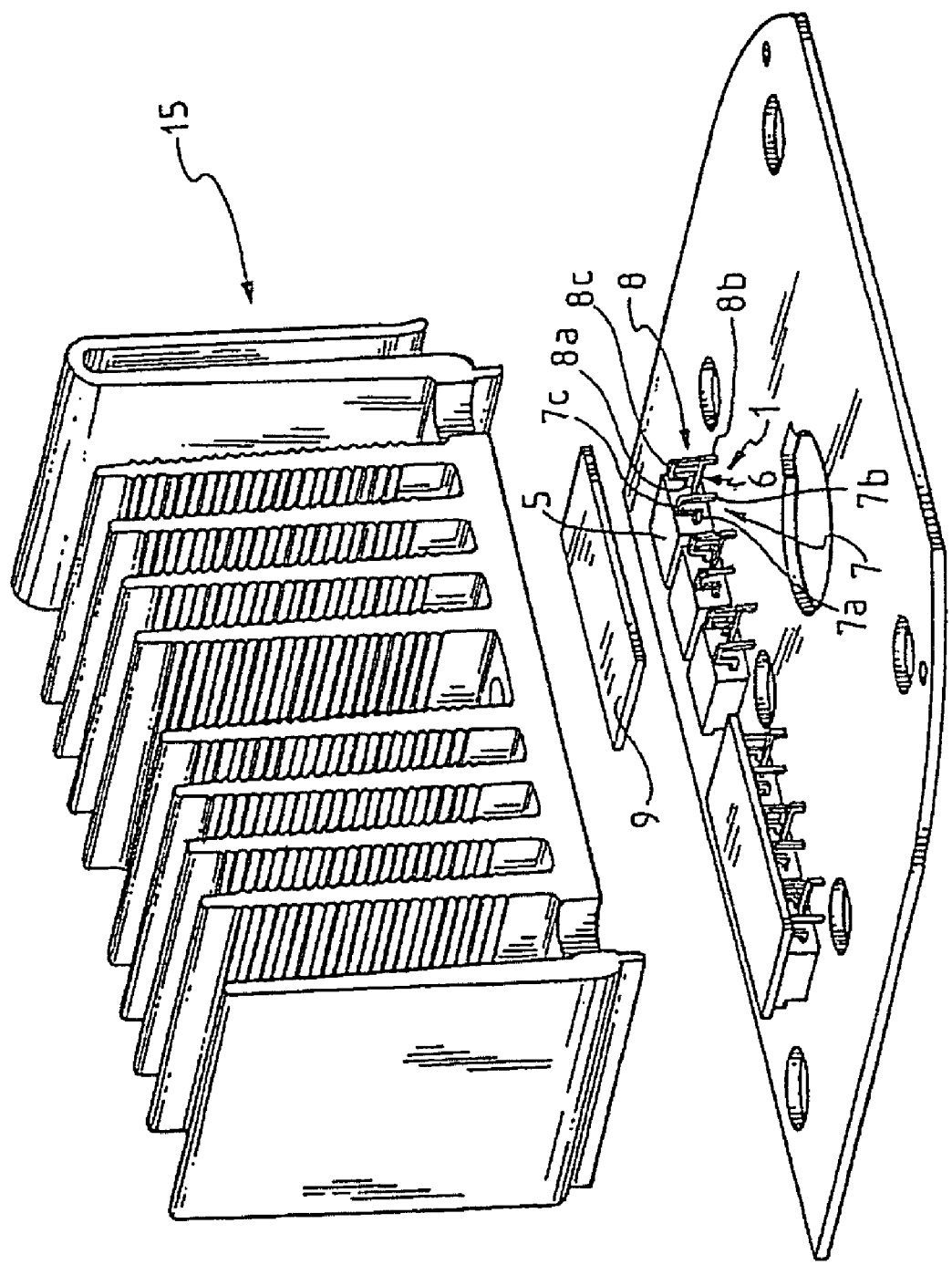
FIG. 2 shows an exploded perspective view of a printed circuit board with some discrete electronic components and other components such as for example a heat sink with fins.

With reference to these figures, and in particular to the example of FIG. 1, 1 globally and schematically indicates a discrete electronic component realised according to the present invention.

The discrete electronic component 1 is substantially of the package-like type and it comprises a body or casing 2, substantially parallelepiped, and some electric connecting pins 3 projecting from at least one side face 2a of the body 2.

More in particular, the component 1 incorporates a power electronic circuit mounted on a small metallic frame, not shown because conventional, wherein the electric connecting pins 3 are defined, and the body 2 is a protection casing realised with insulating plastic material.

The pins 3 are destined for the electric connection on a printed circuit electronic board 4, wherein predetermined conduction paths are defined referring to the pins of the various electronic components.

For convenience in the drawing the reported pins 3 are three. Nothing obviously forbids they can be more or less.

The body 2 is also provided with an internal heat sink element which is represented by a header 5 associated with the supporting small frame of the power electronic circuit and which emerges on top from the body 2 itself.

The header 5 has a width substantially identical to that of the body 2 and it has such a length as to project from the part opposite to the side face 2a wherefrom the pins 3 project. An in-view surface of the header 5 lays on a plane P and it emerges from the body 2.

The pins 3 projecting from the side face 2a have a first section initially extended parallelly to the plane P.

An intermediate pin indicated with number 6 has a standard conformation substantially L-shaped, being initially realised as prolongation of the first section parallel to the plane P and further extending perpendicularly to the plane P, from the opposite part with respect to the header 5, with such a length as to be interconnected with the printed circuit electronic board 4.

The two external pins, 7 and 8, have instead, after the first section parallel to the plane P, a U-shaped bending comprising two sections 7a, 8a and 7b, 8b of unequal length.

Each section 7a and 8a extends along the direction of the header 5, perpendicularly to the plane P, and it has such a length as to allow the base 7c, 8c of the U to be tangent to the plane P.

The terminal sections 7b and 8b of these pins 7 and 8 have instead such a length as to allow them to interconnect with the printed circuit electronic board 4. In substance, the free end sections of the pin 6 and of the pins 7, 8 with U-shaped bending are substantially perpendicular to said plane P and they extend in the opposite direction with respect to the header 5.

In order to improve the heat dissipation an intermediate heat dissipating die 9 is used, for example of good heat conductor metallic material but of reduced cost such as aluminium.

The intermediate die 9 has a first pad 10 counterformed as the header 5 of the discrete electronic component 1; as well as a second pad 11 and a third pad 12 placed and counterformed in order to respectively correspond to the bases 7c and 8c of the two external U-bent pins 7 and 8.

More in particular on the first die 9 a vetronite insulating bearing is pressed-packed with the pads 10, 11 and 12 being silk-screen printed.

The first pad 10, the second 11 and the third pad 13 are silk-screen printed with a cream or alloy paste 13 of the usual type for welding.
This obviously before the automatic assembly of the discrete electronic component 1, facilitated by its particular conformation, on the intermediate die 9 and of their transfer to the remelting oven.

During the stay in the remelting oven the header 5 would tend to make all the body 2 boat on the melted alloy cream 13, however the presence of the further bearings represented by the bases 7c and 8c of the external pins 7 and 8 prevents the discrete electronic component 1 from any rotation. Out of analogy, it is as if the component 1 can be equalised to a table with three bearing points with a first bearing represented by the large portion of the header 5 and further points or bearing legs represented by the U-like bendings of the pins 7 and 8.

Preferably, three discrete electronic components 1 are associated with the intermediate die 9, in the case shown by way of indicative example, according to a predetermined arrangement, adjacent one another with all the pins facing the same direction.

At the output of the remelting oven the three discrete electronic components 1 and the intermediate die 9 become a single module 14 to be associated with the printed circuit electronic board 4.

According to the needs, the printed circuit electronic board 4 can contain more modules 14.

Once the modules 14 are fixed on the printed circuit electronic board 4 above the intermediate die 9 a heat sink 15 with fins of the known type is generally associated.

The main advantage of the present invention is that the discrete electronic component 1, thus realised, results to be blocked according to a predetermined position on the intermediate die 9 before the final assembly thereof on the electronic board.

Moreover, all the pins 3 of each discrete electronic component 1 blocked on the intermediate die 9 result to be aligned in the desired way.

The module 14 manageable like a usual component of the printed circuit electronic board 4 can be assembled without any difficulty by means of an automatized system. Even the modules 14 can be tape supplied to the apparatuses of the pick-and-place type predisposed for automatized assembly of the components on the board.

The assembling system is thus simple, fast and low cost.

Obviously, variations such as for example discrete electronic components 1 with one single pin with substantially U-shaped bending or three or more pins having the same bending will be considered being part of the scope of protection of the invention itself.

The invention claimed is:

1. An electronic system comprising:
   a printed circuit electronic board;
   at least one module associated with said printed circuit electronic board, said module comprising:
   an intermediate heat dissipating die for connecting with a heat-sink;
   at least one substantially package-like discrete electronic component associated to the intermediate die, said discrete electronic component comprising:
   a power electronic circuit;
   a body or casing that is substantially parallelepiped; and
   electric connecting pins connected inside the body with said circuit and projecting from said body;
   wherein said body has a heat dissipating header having at least one surface emerging from the body and laying on a plane;

wherein said pins projecting from said body initially extend parallel to said plane in a first section, and wherein at least one of said pins has a substantially U-shaped bend, after said first section, with the base of the U-shaped bend tangent to said plane;

wherein the at least one discrete electronic component is mounted on top of the printed circuit electronic board, the free end sections of its pins extending substantially perpendicularly to said plane in the opposite direction with respect to said header and providing an electric connection on said printed circuit electronic board and;

wherein the intermediate heat dissipating die is mounted on top of the discrete electronic component, both the heat dissipating header and the base of the U-shaped bend being tied to a lower surface of said intermediate heat dissipating die.

2. The electronic system according to claim 1, wherein the at least one, discrete electronic component comprises two pins with U-shaped bends, the bases of both of the U-shaped bends being tied to the lower surface of the intermediate heat dissipating die.

3. The electronic system according to claim 2, wherein the intermediate heat dissipating die has a first pad counter-formed as the header of the discrete electronic component, as well as a second pad and a third pad placed and counter-formed in order to respectively correspond to the bases of the U-shaped bends of the U-shaped pins.

4. The electronic system according to claim 2, wherein the at least one discrete electronic component comprises three pins projecting from a same side face of the body, the three pins having parallel first sections, the intermediate pin having a standard L-shaped conformation, the external pins featuring said U-shaped bend.

5. The electronic system according to claim 4, wherein the intermediate pin extends further from the side face in a direction parallel to the plane with respect to the external pins.

6. The electronic system according to claim 1, wherein the length of the first section of the U-shaped pins is shorter than the length of the shortest side of the body of the discrete electronic component.

7. The electronic system according to claim 1, wherein each module comprises three discrete electronic components adjacent one another with all the pins facing the same direction.

8. The electronic system according to claim 1, wherein the tie between the at least one discrete electronic component and the intermediate heat dissipating die is obtained by welding with alloy paste.

* * * * *